US012593602B2

(12) United States Patent
Cao et al.

(10) Patent No.: US 12,593,602 B2
(45) Date of Patent: Mar. 31, 2026

(54) DISPLAY PANEL, MANUFACTURING METHOD AND ELECTRONIC DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Weiran Cao, Shenzhen (CN); Jinchuan Li, Shenzhen (CN); Qingwu Yin, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 786 days.

(21) Appl. No.: 17/620,718

(22) PCT Filed: Dec. 10, 2021

(86) PCT No.: PCT/CN2021/137005
§ 371 (c)(1),
(2) Date: Dec. 19, 2021

(87) PCT Pub. No.: WO2023/092688
PCT Pub. Date: Jun. 1, 2023

(65) Prior Publication Data
US 2024/0032397 A1 Jan. 25, 2024

(30) Foreign Application Priority Data
Nov. 25, 2021 (CN) .......................... 202111409410.8

(51) Int. Cl.
*H10K 59/80* (2023.01)

(52) U.S. Cl.
CPC ......... *H10K 59/877* (2023.02); *H10K 59/873* (2023.02)

(58) Field of Classification Search
CPC .. H10K 50/844; H10K 59/873; H10K 50/854; H10K 59/877; H10K 2102/311;
(Continued)

(56) References Cited

U.S. PATENT DOCUMENTS 10,468,632 B2 * 11/2019 Zhai ................... H10K 59/8731
11,158,837 B2 * 10/2021 Kim ....................... H10K 59/40
(Continued)

FOREIGN PATENT DOCUMENTS

CN 103117340 A 5/2013
CN 103794734 A 5/2014
(Continued)

OTHER PUBLICATIONS

Opinion of the International Search Authority (Translated) (Year: 2022).*
(Continued)

*Primary Examiner* — Alia Sabur
(74) *Attorney, Agent, or Firm* — PV IP PC; Christopher S. Ruprecht; Wei Te Chung

(57) ABSTRACT

The present application provides a display panel, a manufacturing method, and an electronic device. The electronic device comprises the display panel. The display panel comprises a light-emitting device layer, an encapsulation layer and a barrier film. First scattering particles are distributed in the encapsulation layer, and the light scattering effect of the first scattering particles on the light-emitting device layer can be employed to improve the viewing angle of the display panel. The barrier film comprises at least two antireflective layers with different refractive indexes to increase the trans- (Continued)

mittance of the barrier film, thereby improving the light extraction efficiency of the display panel.

18 Claims, 3 Drawing Sheets

(58) Field of Classification Search
CPC ........... H10K 59/8731; H10K 50/8445; H10K 50/858; G02B 1/11; C03C 2217/734
See application file for complete search history.

(56) References Cited

U.S. PATENT DOCUMENTS

| | | | |
|---|---|---|---|
| 2004/0131799 A1 | 7/2004 | Arsenault et al. | |
| 2011/0232749 A1* | 9/2011 | Lienhart | H10F 19/30 |
| | | | 204/192.12 |
| 2014/0117330 A1 | 5/2014 | Cho et al. | |
| 2014/0264311 A1* | 9/2014 | Lang | H10K 71/00 |
| | | | 257/40 |
| 2018/0097204 A1 | 4/2018 | Ivan et al. | |
| 2019/0067639 A1 | 2/2019 | Jiang et al. | |
| 2019/0067643 A1 | 2/2019 | Zhai et al. | |
| 2020/0203405 A1* | 6/2020 | Lee | H01L 27/14645 |
| 2021/0066661 A1 | 3/2021 | Kim et al. | |
| 2021/0341649 A1 | 11/2021 | Lim et al. | |

FOREIGN PATENT DOCUMENTS

| | | | |
|---|---|---|---|
| CN | 203643625 U | 6/2014 | |
| CN | 107546338 A | 1/2018 | |
| CN | 108878684 A | 11/2018 | |
| CN | 108933196 A | 12/2018 | |
| CN | 208722925 U | 4/2019 | |
| CN | 209216976 U | 8/2019 | |
| CN | 209216977 U | 8/2019 | |
| CN | 113568080 A | 10/2021 | |
| JP | 2014086415 A | 5/2014 | |
| JP | 2015176734 A | 10/2015 | |
| KR | 20120115841 A | 10/2012 | |
| KR | 20140056498 A | 5/2014 | |
| KR | 20180036869 A | 4/2018 | |
| TW | 201421670 A | 6/2014 | |
| WO | 2016074948 A1 | 5/2016 | |

OTHER PUBLICATIONS

Chinese Office Action issued in corresponding Chinese Patent Application No. 202111409410.8 dated Feb. 24, 2023, pp. 1-9.
Chinese Decision of Rejection issued in corresponding Chinese Patent Application No. 202111409410.8 dated Sep. 1, 2023, pp. 1-7.
Japanese Office Action issued in corresponding Japanese Patent Application No. 特願2021-574802 dated Jan. 16, 2024, pp. 1-6.
International Search Report in International application No. PCT/CN2021/137005, mailed on Apr. 27, 2022.
Written Opinion of the International Search Authority in International application No. PCT/CN2021/137005, mailed on Apr. 27, 2022.
Chinese Office Action issued in corresponding Chinese Patent Application No. 202111409410.8 dated Aug. 3, 2022, pp. 1-10.
Japanese Office Action issued in corresponding Japanese Patent Application No. 特願2021-574802 dated Jun. 4, 2024, pp. 1-6.
European Office Action issued in corresponding European Patent Application No. 21823462.3 dated Oct. 23, 2025, pp. 1-9.

* cited by examiner

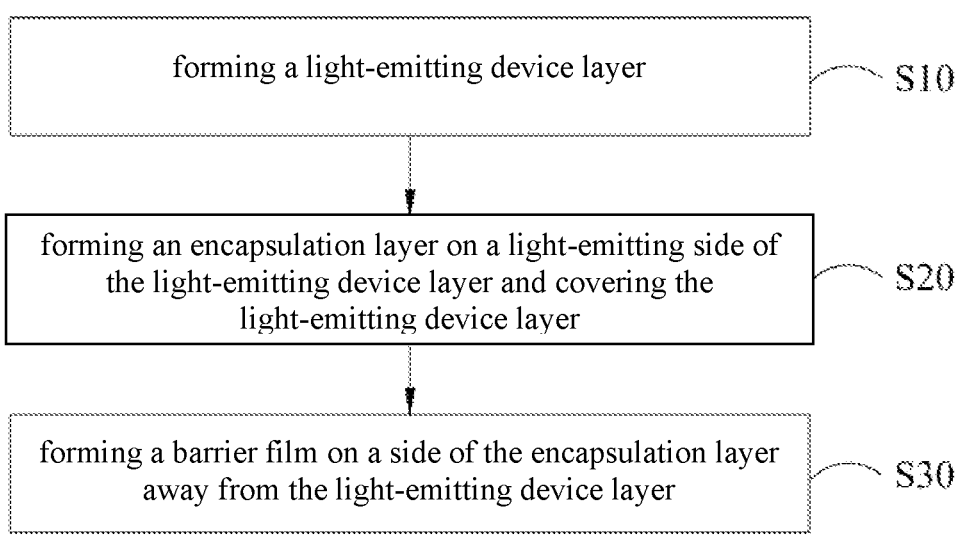
forming a light-emitting device layer — S10
forming an encapsulation layer on a light-emitting side of the light-emitting device layer and covering the light-emitting device layer — S20
forming a barrier film on a side of the encapsulation layer away from the light-emitting device layer — S30
FIG. 2
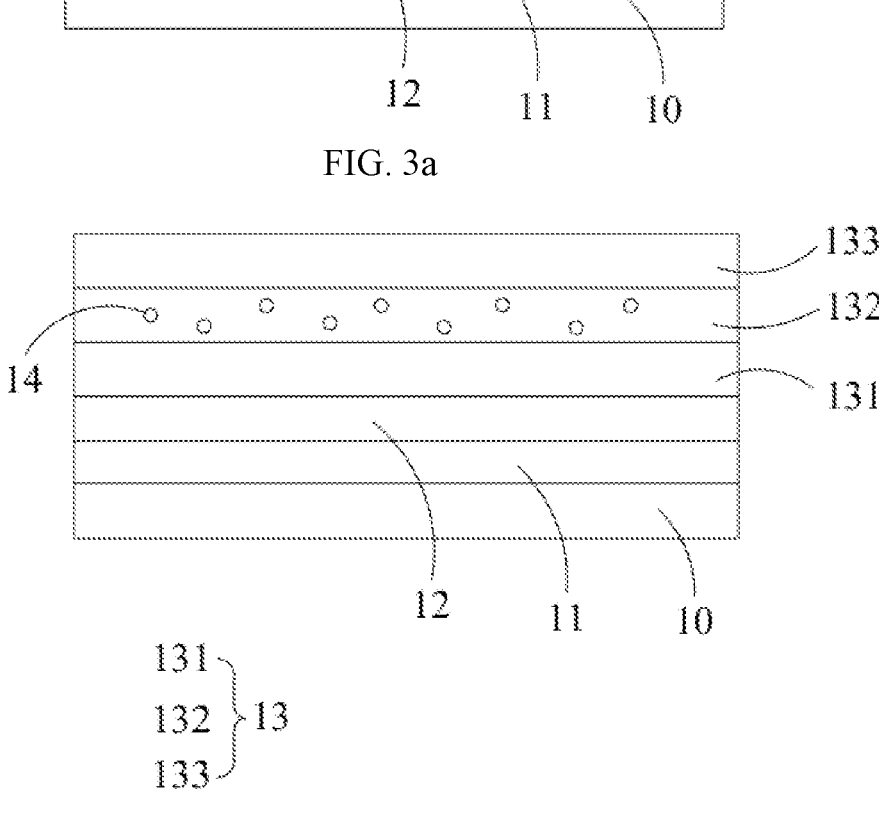
FIG. 3a
FIG. 3b

DISPLAY PANEL, MANUFACTURING METHOD AND ELECTRONIC DEVICE

FIELD OF THE INVENTION

The present application relates to a display field, and more particularly to a display panel, a manufacturing method and an electronic device.

BACKGROUND OF THE INVENTION

In recent years, the development of Organic Light Emitting Diode (OLED) display technology has advanced by leaps and bounds. Organic Light Emitting Diode (OLED) display panels have received more and more attention due to their advantages of lightness and thinness, fast response, wide viewing angle, high contrast and flexibility. They are mainly employed in display fields such as mobile phones, flat panels and televisions.

Organic light-emitting diode display panels can be categorized into top-emission type, bottom-emission type and penetration type according to the light-emitting mode of OLED devices. The top-emission type uses top-emission light. Regardless of the shape of the circuit on the substrate, it possesses no direct effect on the light extraction efficiency of the OLED device, making the top-emission type more efficient than the bottom-emission type and has become the mainstream design method of the current organic light emitting diode display panel. However, in the process of light propagation of the top-emission organic light-emitting diode display panel, due to the mismatch of the refractive index between the various layers of the display panel, a part of the emitted photons will be trapped in the panel due to the waveguide effect. The maximum light extraction cannot be achieved, resulting in low light extraction efficiency of the display panel.

In summary, there is a problem of low light extraction efficiency in the existing top-emitting organic light-emitting diode display panel. Therefore, there is a need to provide a display panel, a manufacturing method and an electronic device to solve the existing problems of the prior art.

SUMMARY OF THE INVENTION

The embodiment of the present application provides a display panel, a manufacturing method and an electronic device, which are employed to solve the problem of low light extraction efficiency in the existing top-emitting organic light-emitting diode display panel.

The embodiment of the present application provides a display panel, comprising:

a light-emitting device layer;

an encapsulation layer being arranged on a light-emitting side of the light-emitting device layer and covering the light-emitting device layer; and a barrier film arranged on a side of the encapsulation layer away from the light-emitting device layer;

wherein first scattering particles are distributed in the encapsulation layer, and the barrier film comprises at least two antireflective layers with different refractive indexes.

According to one embodiment of the present application, the thin film encapsulation layer comprises:

a first inorganic encapsulation layer arranged on the light-emitting side of the light-emitting device layer;

an organic encapsulation layer arranged on a side of the first inorganic encapsulation layer away from the light-emitting device layer; and a second inorganic encapsulation layer being arranged at a side of the first inorganic encapsulation layer and covering the organic encapsulation layer;

wherein the first scattering particles are distributed in the organic encapsulation layer.

According to one embodiment of the present application, a refractive index of the first scattering particles is greater than a refractive index of the organic encapsulation layer.

According to one embodiment of the present application, the antireflective layers comprise:

a first antireflective layer arranged on the side of the encapsulation layer away from the light-emitting device layer; and a second antireflective layer arranged on a side of first antireflective layer away from the encapsulation layer;

wherein the refractive index of the first antireflective layer is greater than the refractive index of the second antireflective layer.

According to one embodiment of the present application, the refractive index of the first antireflective layer is greater than or equal to 1.8, and the refractive index of the second antireflective layer is greater than or equal to 1.3, and less than or equal to 1.6.

According to one embodiment of the present application, the barrier film further comprises a barrier layer arranged between the first antireflective layer and the second antireflective layer;

wherein a refractive index of the barrier layer is less than the refractive index of the first antireflective layer, and is greater than the refractive index of the second antireflective layer.

According to one embodiment of the present application, the display panel further comprises an adhesive layer arranged between the encapsulation layer and the barrier film;

wherein second scattering particles are distributed in the adhesive layer.

According to one embodiment of the present application, a refractive index of the adhesive layer is less than the refractive index of the first antireflective layer.

According to one embodiment of the present application, a refractive index of the second scattering particles is greater than the refractive index of the adhesive layer.

The embodiment of the present application further provides an electronic device, comprising a display panel, wherein the display panel comprises:

a light-emitting device layer;

an encapsulation layer being arranged on a light-emitting side of the light-emitting device layer and covering the light-emitting device layer; and a barrier film arranged on a side of the encapsulation layer away from the light-emitting device layer;

wherein first scattering particles are distributed in the encapsulation layer, and the barrier film comprises at least two antireflective layers with different refractive indexes.

According to one embodiment of the present application, the thin film encapsulation layer comprises:

a first inorganic encapsulation layer arranged on the light-emitting side of the light-emitting device layer;

an organic encapsulation layer arranged on a side of the first inorganic encapsulation layer away from the light-emitting device layer; and a second inorganic encapsulation layer being arranged at a side of the first inorganic encapsulation layer and covering the organic encapsulation layer;

wherein the first scattering particles are distributed in the organic encapsulation layer.

According to one embodiment of the present application, a refractive index of the first scattering particles is greater than a refractive index of the organic encapsulation layer.

According to one embodiment of the present application, the antireflective layers comprise:

a first antireflective layer arranged on the side of the encapsulation layer away from the light-emitting device layer; and a second antireflective layer arranged on a side of first antireflective layer away from the encapsulation layer;

wherein the refractive index of the first antireflective layer is greater than the refractive index of the second antireflective layer.

According to one embodiment of the present application, the refractive index of the first antireflective layer is greater than or equal to 1.8, and the refractive index of the second antireflective layer is greater than or equal to 1.3, and less than or equal to 1.6.

The embodiment of the present application further provides a manufacturing method of a display panel, employed to manufacture the aforesaid display panel, wherein the manufacturing method of the display panel comprises:

forming a light-emitting device layer;

forming an encapsulation layer on a light-emitting side of the light-emitting device layer and covering the light-emitting device layer; and forming a barrier film on a side of the encapsulation layer away from the light-emitting device layer;

wherein first scattering particles are distributed in the encapsulation layer, and the barrier film comprises at least two antireflective layers with different refractive indexes.

According to one embodiment of the present application, the step of forming the encapsulation layer on the light-emitting side of the light-emitting device layer and covering the light-emitting device layer comprises:

forming a first inorganic encapsulation layer on the light-emitting side of the light-emitting device layer;

forming an organic encapsulation layer on a side of the first inorganic encapsulation layer away from the light-emitting device layer; and forming a second inorganic encapsulation layer at a side of the first inorganic encapsulation layer and covering the organic encapsulation layer;

wherein the first scattering particles are distributed in the organic encapsulation layer.

According to one embodiment of the present application, a refractive index of the first scattering particles is greater than a refractive index of the organic encapsulation layer.

According to one embodiment of the present application, the step of forming the barrier film on the side of the encapsulation layer away from the light-emitting device layer comprises:

forming a first antireflective layer; and forming a second antireflective layer on a side of the first antireflective layer;

wherein the refractive index of the first antireflective layer is greater than the refractive index of the second antireflective layer.

According to one embodiment of the present application, the step of forming the barrier film on the side of the encapsulation layer away from the light-emitting device layer further comprises:

forming a barrier layer on the side of the first antireflective layer before forming the second antireflective layer; and forming the second antireflective layer on a side of the barrier layer away from the first antireflective layer;

wherein a refractive index of the barrier layer is less than the refractive index of the first antireflective layer, and is greater than the refractive index of the second antireflective layer.

According to one embodiment of the present application, the step of forming the barrier film on the side of the encapsulation layer away from the light-emitting device layer further comprises:

adhering the side of the first antireflective layer away from the barrier layer with the side of the encapsulation layer away from the light-emitting device layer through an adhesive layer;

wherein second scattering particles are distributed in the adhesive layer.

The benefits of the embodiment of the present application are: the embodiment of the present application provides a display panel, a manufacturing method, and an electronic device. The display panel comprises a light-emitting device layer, an encapsulation layer and a barrier film. The encapsulation layer is arranged on a light-emitting side of the light-emitting device layer and covers the light-emitting device layer. The barrier film is arranged on a side of the encapsulation layer away from the light-emitting device layer. First scattering particles are distributed in the encapsulation layer, and the light scattering effect of the first scattering particles on the light-emitting device layer can be employed to improve the viewing angle of the display panel. The barrier film comprises at least two antireflective layers with different refractive indexes. to increase the transmittance of the barrier film, thereby improving the light extraction efficiency of the display panel.

BRIEF DESCRIPTION OF THE DRAWINGS

In order to more clearly illustrate the embodiments of the present application and the prior art, the following figures will be described in the embodiments and the prior art are briefly introduced. It is obvious that the drawings are only some embodiments of the present application, those of ordinary skill in this field can obtain other figures according to these figures without paying the premise.

FIG. 2 is a flowchart of a manufacturing method of a display panel provided by an embodiment of the application;

FIG. 3a to FIG. 3c are flowcharts of a manufacturing method of a display panel provided by an embodiment of the application.

DETAILED DESCRIPTION OF PREFERRED EMBODIMENTS

Figure 1:
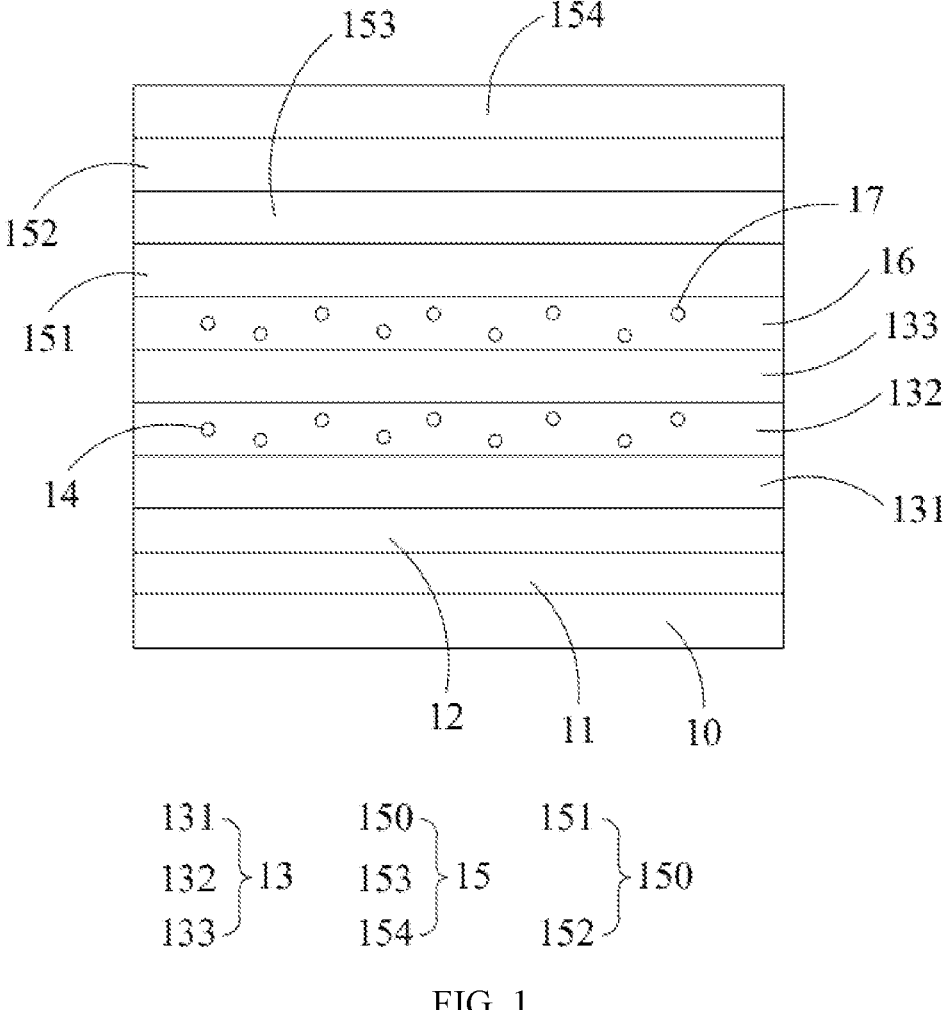
FIG. 1 is a structural diagram of a display panel provided by an embodiment of the application.

The following descriptions for the respective embodiments are specific embodiments capable of being implemented for illustrations of the present application with referring to appended figures. The terms of up, down, front, rear, left, right, interior, exterior, side, etcetera mentioned in the present application are merely directions of referring to appended figures. Thus, the used directional terms are used to describe and understand the present application, but the present invention is not limited thereto. In the figure, units with similar structures are denoted by the same reference numerals.

The present application will be further described in detail with the accompanying drawings and the specific embodiments.

The embodiment of the present application provides a display panel and an electronic device. The electronic device comprises the display panel, a housing for carrying the display panel, and components such as a processor and a power supply arranged in the housing for driving the display panel to realize a screen display function. The electronic device may be a mobile terminal, such as a smart phone, a tablet computer, a notebook computer, etc. The electronic device may also be a wearable terminal, such as a smart watch, a smart bracelet, smart glasses, an augmented reality device, etc. The electronic device may also be a fixed terminal, such as a desktop computer, a television, etc.

As shown in FIG. 1, FIG. 1 is a structural diagram of a display panel provided by an embodiment of the application. The display panel comprises a base substrate 10, an array layer 11 and a light-emitting device layer 12 stacked on the base substrate 10, sequentially. The light-emitting device layer 12 is provided with a plurality of light-emitting units, and the array layer 11 is provided with a plurality of pixel driving circuits for controlling and driving the light-emitting units to emit light. The pixel driving circuit is composed of a plurality of thin film transistors, capacitors, signal lines and scanning lines.

In the embodiment of the present application, the light-emitting unit comprises an organic light-emitting diode. In practical applications, the type of the light-emitting unit is not limited to the organic light-emitting diode in the foregoing embodiment, and may also be a micro light-emitting diode (Micro LED) or a mini light-emitting diode (Mini LED).

The display panel further comprises an encapsulation layer 13, which is arranged on the light-emitting side of the light-emitting device layer 12 and covers the light-emitting device layer 12 to prevent water vapor and oxygen from intruding into the light-emitting device layer 12 to cause a light-emitting unit damaged.

Furthermore, first scattering particles 14 are distributed in the encapsulation layer 13. The first scattering particles 14 are nanoparticles, and the refractive index of the first scattering particles 14 is different from the refractive index of the encapsulation layer 13, so that the first scattering particles 14 possess a refraction effect on the light irradiated to the interface between the first scattering particles 14 and the encapsulation layer 13. By controlling the content or mass ratio of the first scattering particles 14 in the encapsulation layer 13, the refractive index of the encapsulation layer 13 can be adjusted to increase or decrease the emitting angle of the light emitted by the light-emitting device layer 12, thereby the viewing angle of the display panel can be improved.

In the embodiment of the present application, as shown in FIG. 1, the encapsulation layer 13 comprises a first inorganic encapsulation layer 131, an organic encapsulation layer 132 and a second inorganic encapsulation layer. The first inorganic encapsulation layer 131 is arranged on the light-emitting side of the light-emitting device layer 12. The organic encapsulation layer 132 is arranged on a side of the first inorganic encapsulation layer away from the light-emitting device layer 12. The second inorganic encapsulation layer 133 is arranged on a side of the first inorganic encapsulation layer 131 away from the light-emitting device layer 12 and covers the organic encapsulation layer 132.

Specifically, the first inorganic encapsulation layer 131 is made of an inorganic transparent material, and the inorganic transparent material may comprise, but is not limited to, at least one of SiO, SiN, or SiON. In the actual preparation process, the first inorganic encapsulation layer 131 may be prepared by plasma enhanced chemical vapor deposition (PECVD) or atomic layer deposition (ALD).

In the embodiment of the present application, the thickness of the first inorganic encapsulation layer 131 is 1 µm. In practical applications, the thickness of the first inorganic encapsulation layer 131 is not limited to 1 µm in the foregoing embodiment, and may also be 0.8 µm, 0.6 µm, 1.2 µm, 1.4 µm or the like.

The organic encapsulation layer 132 is made of an organic transparent material, and the organic transparent material may comprise, but is not limited to, epoxy resin or acrylic material. In the actual preparation process, the organic encapsulation layer 132 may be prepared by inkjet printing, screen printing, electronic spraying or the like.

In the embodiment of the present application, the thickness of the organic encapsulation layer 132 is 10 µm. In practical applications, the thickness of the organic encapsulation layer 132 is not limited to 10 µm in the foregoing embodiment, and may also be 8 µm, 6 µm, 12 µm or 14 µm.

Specifically, the second inorganic encapsulation layer 133 is made of an inorganic transparent material, and the inorganic transparent material may comprise, but is not limited to, at least one of SiO, SiN, or SiON. In the actual preparation process, the second inorganic encapsulation layer 133 can be prepared using the same material and the same preparation process as the first inorganic encapsulation layer 131.

As shown in FIG. 1, the first scattering particles 14 are distributed in the organic encapsulation layer 132.

In the embodiment of the present application, the first scattering particles 14 are made of nano-scale organic silicon materials. In practical applications, the material of the first scattering particles 14 is not limited to the nano-scale organic silicon materials in the foregoing embodiment, and can also be made of inorganic materials. The inorganic materials may comprise, but are not limited to, at least one or a mixture of $SiN_x$, $Si_3N_4$, $TiO_2$, $MgO$, $ZnO$, $SnO_2$, $Al_2O_3$ and $CaF_2$.

Furthermore, the refractive index of the first scattering particles 14 is greater than the refractive index of the organic encapsulation layer 132. The light is mainly refracted at the interface between the organic encapsulation layer 132 and the first scattering particles 14. When light enters the first reflective particle 14 from the organic encapsulation layer 132, since the refractive index of the first scattering particle 14 is greater than the refractive index of the organic encapsulation layer 132, the incident angle of the light is greater than the refraction angle to make the light emitted by the light emitting device layer 12 converge toward the middle. Thus, the forward light extraction efficiency of the display panel can be improved, and the viewing angle of the display panel can be improved.

In the embodiment of the present application, the refractive index of the organic encapsulation layer 132 is greater than or equal to 1.45, and less than or equal to 1.55. The refractive index of the first scattering particles 14 is greater than or equal to 1.8, and less than or equal to 2. Specifically, the refractive index of the organic encapsulation layer 132 may be 1.45, 1.5 or 1.55, etc. The refractive index of the first scattering particles 14 may be 1.8, 1.9, or 2.0, etc.

It should be noted that the structure of the encapsulation layer 13 is not limited to the foregoing three-layer encapsulation structure formed by the first inorganic encapsulation layer 131, the organic encapsulation layer 132 and the second inorganic encapsulation layer 133, and can also be formed by interspersing and superimposing multilayer inorganic encapsulation layers and multilayer organic encapsulation layers. The first scattering particles 14 can be uniformly distributed in at least one organic encapsulation layer in the multilayer organic encapsulation layers.

The display panel further comprises a barrier film 15, and the barrier film 15 is arranged on a side of the encapsulation layer 13 away from the light-emitting device layer 12 and covers the encapsulation layer 13. The barrier film 15 can further encapsulate the light-emitting device layer 12 and the array layer 11, and prevent water vapor and oxygen from intruding into the light-emitting device layer 12 and the array layer 11.

Furthermore, the barrier film 15 comprises at least two antireflective layers 150 with different refractive indexes. By using the difference in refractive indexes of at least two antireflective layers 150, the light transmittance of the barrier film 15 can be increased, thereby improving the light extraction efficiency of the display panel.

As shown in FIG. 1, the antireflective layers 150 comprises a first antireflective layer 151 and a second antireflective layer 152. The first antireflective layer 151 is arranged on a side of the encapsulation layer 13 away from the light-emitting device layer 12, and the second antireflective layer 152 is arranged on a side of the first antireflective layer 151 away from the encapsulation layer 13. The refractive index of the first antireflective layer 151 is greater than the refractive index of the second antireflective layer 152.

In the embodiment of the present application, the refractive index of the first antireflective layer 151 should be greater than or equal to 1.8, and the refractive index of the first antireflective layer 151 may specifically be 1.8, 1.9, 2.0 or the like. The refractive index of the second antireflective layer 152 should be greater than or equal to 1.3, and less than or equal to 1.6, and the refractive index of the second antireflective layer 152 may specifically be 1.3, 1.4, 1.5, 1.6 or the like.

The first antireflective layer 151 may be made of transparent organic material or transparent inorganic material. The transparent organic material may comprise organosiloxane. The transparent inorganic material may comprise any one or a mixture of TiO2, ZrO2 or ZnO.

The second antireflective layer 152 may be made of transparent organic material or inorganic material. The transparent organic material may comprise but is not limited to at least one of epoxy resin or polyacrylic resin. The transparent inorganic material may comprise SiOx.

In the embodiment of the present application, the barrier film 15 further comprises a barrier layer 153. The barrier layer 153 is arranged between the first antireflective layer 151 and the second antireflective layer 152. The barrier layer 153 may be formed on the first antireflective layer 151 by means of atomic layer deposition or sputtering.

Furthermore, the refractive index of the barrier layer 153 is less than the refractive index of the first antireflective layer 151, and greater than the refractive index of the second antireflective layer 152.

In the embodiment of the present application, the barrier layer 153 is a high water barrier film layer, and the refractive index of the barrier layer 153 should be greater than or equal to 1.6, and less than or equal to 1.7. The refractive index of the barrier layer 153 may specifically be 1.6, 1.65, 1.7 or the like.

In practical applications, the structure of the barrier film 15 is not limited to the laminated structure of the first antireflective layer 151, the barrier layer 153 and the second antireflective layer 152 that are sequentially stacked from bottom to top in the foregoing embodiment, but can also be a laminated structure in which three or more antireflective layers with different refractive indexes are alternately arranged. By alternately arranging the three or more antireflective layers with different refractive indexes, the light extraction efficiency of the display panel can also be adjusted.

Furthermore, the barrier film 15 further comprises a protective layer 154. The protective layer 154 is arranged on the surface of the second antireflective layer 152 away from the barrier layer 153. The material of the protective layer 154 may comprise but not limited to PET, COP and PMMA.

In the embodiment of the present application, the display panel further comprises an adhesive layer 16. The adhesive layer 16 is arranged between the encapsulation layer 13 and the barrier film 15. The barrier film 15 is attached to the encapsulation layer 13 through the adhesive layer 16.

Furthermore, second scattering particles 17 are distributed in the adhesive layer 16. The second scattering particles 17 are nanoparticles, and the refractive index of the second scattering particles 17 is greater than the refractive index of the adhesive layer 16, so that the second scattering particles 17 possess a refraction effect on the light irradiated to the interface between the second scattering particles 17 and the adhesive layer 16. By adding the second scattering particles 17 to the adhesive layer 16, the refractive index of the adhesive layer 16 can be increased, so that the large-angle light emitted by the light-emitting device layer 12 is further converged to the middle, thereby improving the forward light extraction efficiency of the display panel and improving the viewing angle of the display panel.

Furthermore, the refractive index of the adhesive layer 16 is less than the refractive index of the first antireflective layer 151.

In the embodiment of the present application, the adhesive layer 16 may be pressure sensitive adhesive (PSA) or optical adhesive. The refractive index of the adhesive layer 16 should be greater than or equal to 1.45, and less than or equal to 1.5. The refractive index of the adhesive layer 16 may specifically be 1.45, 1.47, 1.49, 1.5 or the like.

Figure 3C:
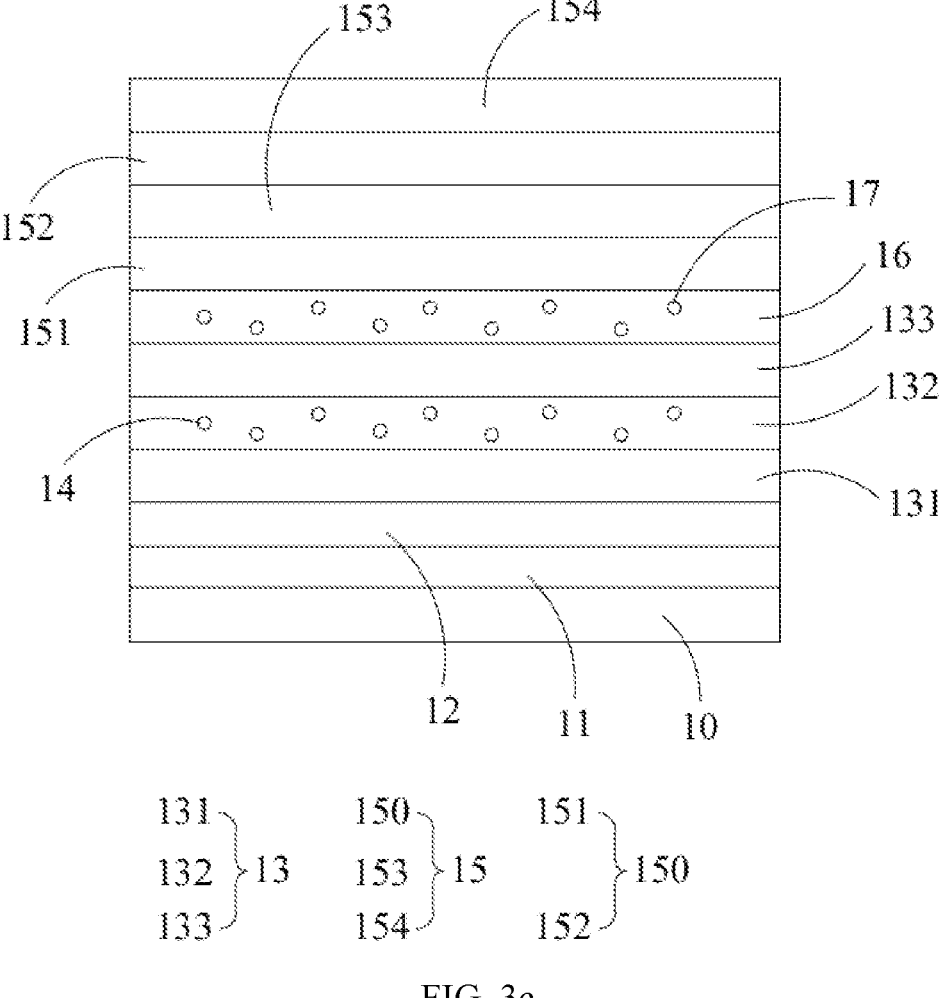

As shown in FIG. 2 and FIG. 3a to FIG. 3c, FIG. 2 is a flowchart of a manufacturing method of a display panel provided by an embodiment of the application. FIG. 3a to FIG. 3c are flowcharts of a manufacturing method of a display panel provided by an embodiment of the application. The manufacturing method of the display panel is employed to manufacture the display panel in the foregoing embodiment. The manufacturing method of the display panel comprises:

Step S10: forming a light-emitting device layer 12.

As shown in FIG. 3a, in Step S10, the light-emitting device layer 12 is formed on a side of the base substrate 10. A plurality of light-emitting units are provided in the light-emitting device layer 12, and the light-emitting unit comprises an organic light-emitting diode. When preparing and forming the light-emitting device layer 12, a plurality of pixel openings can be formed first by etching the pixel defining layer in the light-emitting device layer 12. A light-emitting layer is formed in the pixel opening by evaporation or inkjet printing, and then a corresponding electrode is deposited on the light-emitting layer by physical vapor deposition or sputtering. The material of the electrode may comprise, but is not limited to, Al or Ag.

Before forming the light-emitting device layer 12 on the base substrate 10, an array layer 11 should also be formed on the base substrate 10. The array layer 11 is provided with a plurality of pixel driving circuits for controlling and driving the light-emitting unit to emit light. The pixel driving circuit is composed of a plurality of thin film transistors, capacitors, signal lines and scanning lines.

Step S20: forming an encapsulation layer 13 on a light-emitting side of the light-emitting device layer 12 and covering the light-emitting device layer 12.

As shown in FIG. 3b, first scattering particles 14 are distributed in the encapsulation layer 13. The first scattering particles 14 possess light scattering effect, and the light will be refracted when passing through the first scattering particles 14 from the encapsulation layer 13, so that the light is emitted from the first scattering particles 14 with a larger angle. Thus, the emitting angle of the light can be increased, so that the viewing angle of the display panel can be improved.

Furthermore, as shown in FIG. 3b, in Step S20, the step of forming the encapsulation layer 13 on the light-emitting side of the light-emitting device layer 12 and covering the light-emitting device layer 12 comprises:

Step S201: forming a first inorganic encapsulation layer 131 on the light-emitting side of the light-emitting device layer 12;

Step S202: forming an organic encapsulation layer 132 on a side of the first inorganic encapsulation layer 131 away from the light-emitting device layer 12; and Step S203: forming a second inorganic encapsulation layer 133 at a side of the first inorganic encapsulation layer 131 away from the light-emitting device layer 12, wherein the second inorganic encapsulation layer 133 covers the organic encapsulation layer 132;

in Step S201, the first inorganic encapsulation layer can be formed by using an inorganic transparent material through plasma-enhanced chemical vapor deposition or atomic layer deposition. The first inorganic encapsulation layer is made of an inorganic transparent material, and the inorganic transparent material may comprise, but is not limited to, at least one of SiO, SiN, or SiON.

In the embodiment of the present application, the thickness of the first inorganic encapsulation layer 131 is 1 μm. In practical applications, the thickness of the first inorganic encapsulation layer 131 is not limited to 1 μm in the foregoing embodiment, and may also be 0.8 μm, 0.6 μm, 1.2 μm, 1.4 μm or the like.

In Step S202, the organic encapsulation layer 132 may be prepared by using organic transparent materials through inkjet printing, screen printing, electronic spraying, etc. The organic transparent material may comprise, but is not limited to, epoxy resin or acrylic material.

In the embodiment of the present application, the thickness of the organic encapsulation layer 132 is 10 μm. In practical applications, the thickness of the organic encapsulation layer 132 is not limited to 10 μm in the foregoing embodiment, and may also be 8 μm, 6 μm, 12 μm or 14 μm.

In the embodiment of the present application, the first scattering particles 14 are distributed in the organic encapsulation layer 132. The refractive index of the first scattering particles 14 is greater than the refractive index of the organic encapsulation layer 132.

The first scattering particles 14 are made of nano-scale organic silicon materials. In practical applications, the material of the first scattering particles 14 is not limited to the nano-scale organic silicon materials in the foregoing embodiment, and can also be made of inorganic materials. The inorganic materials may comprise, but are not limited to, at least one or a mixture of SiNx, Si3N4, TiO2, MgO, ZnO, SnO2, Al2O3 and CaF2.

Specifically, the second inorganic encapsulation layer 133 is made of an inorganic transparent material, and the inorganic transparent material may comprise, but is not limited to, at least one of SiO, SiN, or SiON. In the actual preparation process, the second inorganic encapsulation layer 133 can be prepared using the same material and the same preparation process as the first inorganic encapsulation layer 131.

Furthermore, the refractive index of the first scattering particles 14 is greater than the refractive index of the organic encapsulation layer 132. The light is mainly refracted at the interface between the organic encapsulation layer 132 and the first scattering particles 14. When light enters the first reflective particle 14 from the organic encapsulation layer 132, since the refractive index of the first scattering particle 14 is greater than the refractive index of the organic encapsulation layer 132, the incident angle of the light is greater than the refraction angle to make the light emitted by the light emitting device layer 12 converge toward the middle. Thus, the forward light extraction efficiency of the display panel can be improved, and the viewing angle of the display panel can be improved.

In the embodiment of the present application, the refractive index of the organic encapsulation layer 132 is greater than or equal to 1.45, and less than or equal to 1.55. The refractive index of the first scattering particles 14 is greater than or equal to 1.8, and less than or equal to 2. Specifically, the refractive index of the organic encapsulation layer 132 may be 1.45, 1.5 or 1.55, etc. The refractive index of the first scattering particles 14 may be 1.8, 1.9, or 2.0, etc.

It should be noted that the structure of the encapsulation layer 13 is not limited to the foregoing three-layer encapsulation structure formed by the first inorganic encapsulation layer 131, the organic encapsulation layer 132 and the second inorganic encapsulation layer 133, and can also be formed by interspersing and superimposing multilayer inorganic encapsulation layers and multilayer organic encapsulation layers. The first scattering particles 14 can be uniformly distributed in at least one organic encapsulation layer in the multilayer organic encapsulation layers.

Step S30, forming a barrier film 15 on a side of the encapsulation layer 13 away from the light-emitting device layer 12.

In the embodiment of the present application, the barrier film 15 comprises at least two antireflective layers with different refractive indexes. By using the difference in refractive indexes of at least two antireflective layers, the light transmittance of the barrier film 15 can be increased, thereby improving the display result of the display panel.

As shown in FIG. 3c, in Step S30, the step of forming the barrier film 15 on the side of the encapsulation layer 13 away from the light-emitting device layer 12 comprises: forming a first antireflective layer 151 on a side of the encapsulation layer 13 away from the light-emitting device layer 12; and forming a second antireflective layer 152 on a side of the first antireflective layer 151 away from the encapsulation layer 13.

The first antireflective layer 151 may be made of transparent organic material or transparent inorganic material.

The transparent organic material may comprise organosiloxane. The transparent inorganic material may comprise any one or a mixture of TiO2, ZrO2 or ZnO.

The second antireflective layer 152 may be made of transparent organic material or inorganic material. The transparent organic material may comprise but is not limited to at least one of epoxy resin or polyacrylic resin. The transparent inorganic material may comprise SiOx.

In the embodiment of the present application, the refractive index of the first antireflective layer 151 should be greater than or equal to 1.8, and the refractive index of the first antireflective layer 151 may specifically be 1.8, 1.9, 2.0 or the like. The refractive index of the second antireflective layer 152 should be greater than or equal to 1.3, and less than or equal to 1.6, and the refractive index of the second antireflective layer 152 may specifically be 1.3, 1.4, 1.5, 1.6 or the like.

In Step S30, the step of forming the barrier film 15 on the side of the encapsulation layer 13 away from the light-emitting device layer 12 further comprises:

forming a barrier layer 153 on the side of the first antireflective layer 151 away from the encapsulation layer 13 before forming the second antireflective layer 152; and forming the second antireflective layer 152 on a side of the barrier layer 153 away from the first antireflective layer 151.

In Step S30, the barrier layer 153 may be formed on the first antireflective layer 151 by means of atomic layer deposition or sputtering.

Furthermore, the refractive index of the barrier layer 153 is less than the refractive index of the first antireflective layer 151, and greater than the refractive index of the second antireflective layer 152.

In the embodiment of the present application, the barrier layer 153 is a high water barrier film layer, and the refractive index of the barrier layer 153 should be greater than or equal to 1.6, and less than or equal to 1.7. The refractive index of the barrier layer 153 may specifically be 1.6, 1.65, 1.7 or the like.

In practical applications, the structure of the barrier film 15 is not limited to the laminated structure of the first antireflective layer 151, the barrier layer 153 and the second antireflective layer 152 that are sequentially stacked from bottom to top in the foregoing embodiment, but can also be a laminated structure in which three or more antireflective layers with different refractive indexes are alternately arranged. By alternately arranging the three or more antireflective layers with different refractive indexes, the light extraction efficiency of the display panel can also be adjusted.

Furthermore, the step of forming the barrier film 15 on the side of the encapsulation layer 13 away from the light-emitting device layer 12 further comprises:

adhering the side of the first antireflective layer 151 away from the barrier layer 153 with the side of the encapsulation layer 13 away from the light-emitting device layer 12 through an adhesive layer 16.

In the embodiment of the present application, second scattering particles 17 are distributed in the adhesive layer 16.

The refractive index of the second scattering particles 17 is greater than the refractive index of the adhesive layer 16. The light is refracted when passing through the second scattering particles 17 from the adhesive layer 16, so that the light is emitted from the second scattering particles 17 at a larger angle. Thus, the emitting angle of the light can be increased, so that the viewing angle of the display panel can be improved.

Furthermore, the refractive index of the adhesive layer 16 is less than the refractive index of the first antireflective layer 151.

In the embodiment of the present application, the refractive index of the adhesive layer 16 is 1.5. In practical applications, the refractive index of the adhesive layer 16 is not limited to 1.5 in the foregoing embodiment, but can also be 1.45, 1.47, or 1.49, etc., and only needs to be greater than or equal to 1.45, and less than or equal to 1.5.

The embodiment of the present application provides a display panel, a manufacturing method, and an electronic device. The display panel comprises a light-emitting device layer, an encapsulation layer and a barrier film. The encapsulation layer is arranged on a light-emitting side of the light-emitting device layer and covers the light-emitting device layer. The barrier film is arranged on a side of the encapsulation layer away from the light-emitting device layer. First scattering particles are distributed in the encapsulation layer, and the light scattering effect of the first scattering particles on the light-emitting device layer can be employed to improve the viewing angle of the display panel. The barrier film comprises at least two antireflective layers with different refractive indexes. to increase the transmittance of the barrier film, thereby improving the light extraction efficiency of the display panel.

In summary, although the above preferred embodiments of the present application are disclosed, the foregoing preferred embodiments are not intended to limit the invention, those skilled in the art can make various kinds of alterations and modifications without departing from the spirit and scope of the present application. Thus, the scope of protection of the present application is defined by the scope of the claims.

What is claimed is:

1. A display panel, comprising:
a light-emitting device layer;
an encapsulation layer being arranged on a light-emitting side of the light-emitting device layer and covering the light-emitting device layer;
a barrier film arranged on a side of the encapsulation layer away from the light-emitting device layer; and
an adhesive layer arranged between the encapsulation layer and the barrier film;
wherein first scattering particles are distributed in the encapsulation layer, and the barrier film comprises at least two antireflective layers with different refractive indexes,
wherein the antireflective layers comprise a first antireflective layer, a second antireflective layer, and a barrier layer, the first antireflective layer arranged on the side of the encapsulation layer away from the light-emitting device layer, the second antireflective layer arranged on a side of first antireflective layer away from the encapsulation layer, the barrier layer arranged between the first antireflective layer and the second antireflective layer, the barrier layer being a water barrier film layer, and wherein a refractive index of the barrier layer is less than a refractive index of the first antireflective layer, and is greater than a refractive index of the second antireflective layer;
wherein a refractive index of the adhesive layer is less than the refractive index of the first antireflective layer;

wherein second scattering particles are distributed in the adhesive layer, and a refractive index of the second scattering particles is greater than the refractive index of the adhesive layer;

wherein the encapsulation layer is formed by a plurality of inorganic encapsulation layers and a plurality of organic encapsulation layers so that each of the organic encapsulation layers is arranged between two adjacent ones of the plurality of inorganic encapsulation layers, wherein the first scattering particles is uniformly distributed in at least one of the plurality of organic encapsulation layers.

2. The display panel according to claim 1, wherein the encapsulation layer comprises:

a first inorganic encapsulation layer arranged on the light-emitting side of the light-emitting device layer;

an organic encapsulation layer arranged on a side of the first inorganic encapsulation layer away from the light-emitting device layer; and a second inorganic encapsulation layer being arranged at a side of the first inorganic encapsulation layer and covering the organic encapsulation layer;

wherein the first scattering particles are distributed in the organic encapsulation layer.

3. The display panel according to claim 2, wherein a refractive index of the first scattering particles is greater than a refractive index of the organic encapsulation layer.

4. The display panel according to claim 1, wherein the refractive index of the first antireflective layer is greater than or equal to 1.8, and the refractive index of the second antireflective layer is greater than or equal to 1.3, and less than or equal to 1.6.

5. The display panel according to claim 1, wherein the barrier film further comprises a protective layer arranged on a surface of the second antireflective layer away from the barrier layer, wherein the protective layer is made of one or more of PET, COP and PMMA.

6. The display panel according to claim 1, wherein a refractive index of each of the organic encapsulation layers is greater than or equal to 1.45 and less than or equal to 1.55.

7. The display panel according to claim 1, wherein a refractive index of the first scattering particles is greater than or equal to 1.8 and less than or equal to 2.

8. The display panel according to claim 1, wherein the first antireflective layer is made of organosiloxane.

9. The display panel according to claim 1, wherein the second antireflective layer is made of polyacrylic resin.

10. The display panel according to claim 1, wherein a refractive index of the adhesive layer is greater than or equal to 1.45 and less than or equal to 1.5.

11. The display panel according to claim 1, wherein the first scattering particles are made of MgO.

12. An electronic device, comprising a display panel, wherein the display panel comprises:

a light-emitting device layer;

an encapsulation layer being arranged on a light-emitting side of the light-emitting device layer and covering the light-emitting device layer;

a barrier film arranged on a side of the encapsulation layer away from the light-emitting device layer; and an adhesive layer arranged between the encapsulation layer and the barrier film;

wherein first scattering particles are distributed in the encapsulation layer, and the barrier film comprises at least two antireflective layers with different refractive indexes, wherein the antireflective layers comprise a first antireflective layer, a second antireflective layer, and a barrier layer, the first antireflective layer arranged on the side of the encapsulation layer away from the light-emitting device layer, the second antireflective layer arranged on a side of first antireflective layer away from the encapsulation layer, the barrier layer arranged between the first antireflective layer and the second antireflective layer, the barrier layer being a water barrier film layer, and wherein a refractive index of the barrier layer is less than a refractive index of the first antireflective layer, and is greater than a refractive index of the second antireflective layer;

wherein a refractive index of the adhesive layer is less than the refractive index of the first antireflective layer;

wherein second scattering particles are distributed in the adhesive layer, and a refractive index of the second scattering particles is greater than the refractive index of the adhesive layer;

wherein the encapsulation layer is formed by a plurality of inorganic encapsulation layers and a plurality of organic encapsulation layers so that each of the organic encapsulation layers is arranged between two adjacent ones of the plurality of inorganic encapsulation layers, wherein the first scattering particles is uniformly distributed in at least one of the plurality of organic encapsulation layers.

13. The display panel according to claim 12, wherein the encapsulation layer comprises:

a first inorganic encapsulation layer arranged on the light-emitting side of the light-emitting device layer;

an organic encapsulation layer arranged on a side of the first inorganic encapsulation layer away from the light-emitting device layer; and a second inorganic encapsulation layer being arranged at a side of the first inorganic encapsulation layer and covering the organic encapsulation layer;

wherein the first scattering particles are distributed in the organic encapsulation layer.

14. The display panel according to claim 13, wherein a refractive index of the first scattering particles is greater than a refractive index of the organic encapsulation layer.

15. The display panel according to claim 12, wherein the refractive index of the first antireflective layer is greater than or equal to 1.8, and the refractive index of the second antireflective layer is greater than or equal to 1.3, and less than or equal to 1.6.

16. A manufacturing method of a display panel, wherein the manufacturing method of the display panel comprises:

forming a light-emitting device layer;

forming an encapsulation layer on a light-emitting side of the light-emitting device layer and covering the light-emitting device layer;

forming a barrier film on a side of the encapsulation layer away from the light-emitting device layer; and adhering the side of the first antireflective layer away from the barrier layer with the side of the encapsulation layer away from the light-emitting device layer through an adhesive layer;

wherein first scattering particles are distributed in the encapsulation layer, and the barrier film comprises at least two antireflective layers with different refractive indexes, wherein forming the barrier film comprises forming a first antireflective layer on the side of the encapsulation layer away from the light-emitting device layer, forming a barrier layer on a side of the first antireflective layer away from the encapsulation layer, and forming a second antireflective layer on a side of the barrier layer away from the first antireflective layer, wherein the barrier layer is a water barrier film layer, and a refractive index of the barrier layer is less than a refractive index of the first antireflective layer, and is greater than a refractive index of the second antireflective layer;

wherein a refractive index of the adhesive layer is less than the refractive index of the first antireflective layer;

wherein second scattering particles are distributed in the adhesive layer, and a refractive index of the second scattering particles is greater than the refractive index of the adhesive layer;

wherein the encapsulation layer is formed by a plurality of inorganic encapsulation layers and a plurality of organic encapsulation layers so that each of the organic encapsulation layers is arranged between two adjacent ones of the plurality of inorganic encapsulation layers, wherein the first scattering particles is uniformly distributed in at least one of the plurality of organic encapsulation layers.

17. The manufacturing method of the display panel according to claim 16, wherein the step of forming the encapsulation layer on the light-emitting side of the light-emitting device layer and covering the light-emitting device layer comprises:

forming a first inorganic encapsulation layer on the light-emitting side of the light-emitting device layer;

forming an organic encapsulation layer on a side of the first inorganic encapsulation layer away from the light-emitting device layer; and forming a second inorganic encapsulation layer at a side of the first inorganic encapsulation layer and covering the organic encapsulation layer;

wherein the first scattering particles are distributed in the organic encapsulation layer.

18. The manufacturing method of the display panel according to claim 17, wherein a refractive index of the first scattering particles is greater than a refractive index of the organic encapsulation layer.

*  *  *  *  *